US012231142B2

(12) United States Patent
Gupta

(10) Patent No.: US 12,231,142 B2
(45) Date of Patent: Feb. 18, 2025

(54) OVERSAMPLED ANALOG TO DIGITAL CONVERTER

(71) Applicant: TEXAS INSTRUMENTS INCORPORATED, Dallas, TX (US)

(72) Inventor: Amit Kumar Gupta, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 17/874,750

(22) Filed: Jul. 27, 2022

(65) Prior Publication Data

US 2023/0318615 A1 Oct. 5, 2023

Related U.S. Application Data

(60) Provisional application No. 63/327,079, filed on Apr. 4, 2022.

(51) Int. Cl.
*H03M 3/00* (2006.01)
*H03M 1/12* (2006.01)
*H03M 1/20* (2006.01)
*H03M 1/46* (2006.01)

(52) U.S. Cl.
CPC .......... *H03M 1/462* (2013.01); *H03M 1/20* (2013.01); *H03M 1/466* (2013.01)

(58) Field of Classification Search
CPC ........ H03M 1/462; H03M 1/20; H03M 1/466; H03M 1/066; H03M 1/0697; H03M 1/68
USPC ................................ 341/143.144, 155, 172
See application file for complete search history.

(56) References Cited

U.S. PATENT DOCUMENTS

2013/0278453 A1* 10/2013 Steensgaard-Madsen ................... H03M 1/201
341/110

OTHER PUBLICATIONS

International Search Report in corresponding PCT Application No. PCT/US2023/017380, mailed Jul. 21, 2023.
Fan Hua; "High-Resolution SAR ADC with Enhanced Linearity", IEEE Transactions on Circuits and Systems II: Express Briefs, vol. 64, No. 10, (Oct. 1, 2017), pp. 1142-1146, XP093063526, USA.

* cited by examiner

*Primary Examiner* — Jean B Jeanglaude
(74) *Attorney, Agent, or Firm* — Valerie M. Davis; Frank D. Cimino

(57) ABSTRACT

An ADC includes a comparator to provide a comparator output responsive to an input voltage of the ADC and a DAC output voltage; a SAR circuit including a SAR that stores an n-bit digital code that is initialized at a beginning of a conversion phase of the ADC, where the SAR circuit is to update the digital code responsive to the comparator output, where an ADC output is responsive to the digital code at an end of the conversion phase; and a DAC to provide the DAC output voltage responsive to the digital code and a reference voltage. The DAC includes an m-bit CDAC and an (n−m)-bit RDAC to provide an intermediate voltage responsive to the n−m least-significant bits of the digital code and the reference voltage. The CDAC provides the DAC output voltage responsive to the m most-significant bits of the digital code, the intermediate voltage, and reference voltage.

23 Claims, 8 Drawing Sheets

OVERSAMPLED ANALOG TO DIGITAL CONVERTER

CROSS-REFERENCE TO RELATED APPLICATIONS

The present application claims priority to U.S. Provisional Patent Application No. 63/327,079, which was filed Apr. 4, 2022, is titled "OVERSAMPLED ANALOG TO DIGITAL CONVERTER," and is hereby incorporated herein by reference in its entirety.

BACKGROUND

An analog-to-digital converter (ADC) converts an analog input signal (e.g., a voltage) to a digital output signal (also referred to as a "digital code" or simply a "code"). An ADC uniquely represents all analog inputs within a certain range by a limited number of digital output codes. Because the analog scale is continuous, while the digital code scale is discrete, there is a quantization process that introduces an error. That is, a small range of analog voltages will be resolved by the ADC to the same digital output code. As a result, a plot of analog input voltage versus digital output code has a stair step shape. The width of one step is defined as one least-significant bit (LSB) and is often used as the reference unit for other quantities or units of the full analog range. For example, one-half LSB represents an analog quantity equal to one-half of the analog resolution.

SUMMARY

In one example of the description, an ADC includes an input adapted to receive an input voltage; an output; and a comparator having a first input coupled to the input of the ADC, a second input, and an output. The comparator is configured to provide a comparator output at the output responsive to the input voltage and a digital-to-analog converter (DAC) output voltage. The ADC also includes a successive-approximation register (SAR) circuit including an input coupled to the output of the comparator, and including a SAR that is configured to store an n-bit digital code that is initialized to an initial value at a beginning of a conversion phase of the ADC. The SAR circuit is configured to: provide the n-bit digital code as an output at an output of the SAR circuit; and update the n-bit digital code responsive to the comparator output, where the output of the ADC is responsive to the n-bit digital code at an end of the conversion phase. The ADC also includes a DAC having an input and having an output coupled to the second input of the comparator, where the DAC is configured to provide the DAC output voltage responsive to the n-bit digital code and a reference voltage. The DAC includes an m-bit capacitive DAC (CDAC); and an (n−m)-bit resistive DAC (RDAC) coupled between the input of the DAC and the m-bit CDAC, where the RDAC is configured to provide an intermediate DAC voltage responsive to the n−m least-significant bits of the n-bit digital code and the reference voltage. The m-bit CDAC is configured to provide the DAC output voltage responsive to the m most-significant bits of the n-bit digital code, the intermediate DAC voltage, and the reference voltage.

In another example of the description, a method of operating an ADC including a digital-to-analog converter (DAC) that includes an m-bit capacitive DAC (CDAC) and an (n−m)-bit resistive DAC (RDAC) is provided. The method includes comparing an input voltage of the ADC with an output voltage of the DAC; updating an n-bit digital code responsive to the comparison, wherein an output of the ADC is responsive to the n-bit digital code at the end of a conversion phase; providing, by the RDAC, an intermediate DAC voltage responsive to the n−m least-significant bits of the n-bit digital code and a reference voltage; and providing, by the CDAC, the DAC output voltage responsive to the m most-significant bits of the n-bit digital code, the intermediate DAC voltage, and the reference voltage.

In yet another example of the description, an ADC includes an input operable to receive an input voltage and an output operable to provide a digital representation of the input voltage. The ADC also includes a comparator having a first input coupled to the input of the ADC, a second input, and an output, the comparator configured to provide a comparator output at the output responsive to the input voltage and a digital-to-analog converter (DAC) output voltage. The ADC further includes a DAC having an input and having an output coupled to the second input of the comparator, where the DAC is configured to provide the DAC output voltage responsive to an n-bit digital code from a successive-approximation register (SAR) circuit and a reference voltage. The DAC includes an m-bit capacitive DAC (CDAC), where m is an integer greater than zero but less than n; and an (n−m)-bit resistive DAC (RDAC) coupled between the input of the DAC and the m-bit CDAC, where the RDAC is configured to provide an intermediate DAC voltage responsive to the n−m least-significant bits of the n-bit digital code and the reference voltage. The m-bit CDAC is configured to provide the DAC output voltage responsive to the m most-significant bits of the n-bit digital code, the intermediate DAC voltage, and the reference voltage. An output of the ADC is based on a sum of the n-bit digital codes at an end of each of $2^m$ conversion sub-phases.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
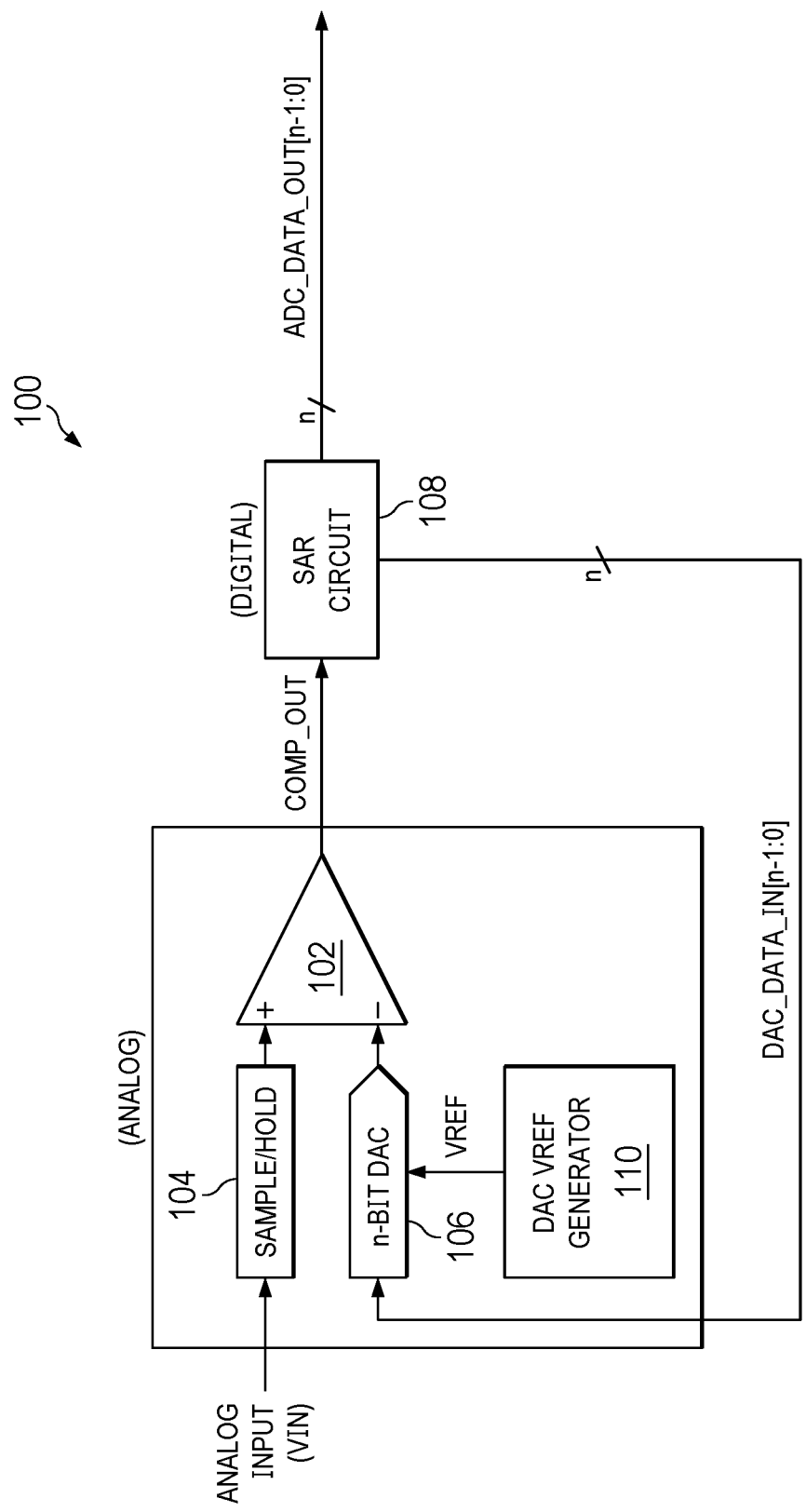
FIG. 1 is a schematic block diagram of an analog-to-digital converter (ADC) in accordance with various examples.

An ADC is useful to sample and convert an analog input signal (e.g., a voltage) to a digital output signal or code. For example, integrated circuits (ICs) for power management (e.g., power ICs), such as those used in battery chargers for electronic devices, use ADCs to monitor various operating parameters (e.g., indicated by corresponding analog voltages). The ADCs provide digital codes indicative of the operating parameters, and the power IC may adjust its operation responsive to those digital codes. For example, a sensed signal (an analog signal that represents a voltage and/or current) may be provided to an ADC that converts the sensed signal to a digital representation of the sensed signal, and the digital signal is provided to a controller/processor that manipulates/processes the digital signal and provides control signals back to the power management device so as to control the operation of the power management device.

Various types of errors exist in ADCs. One example of such an error is a differential nonlinearity (DNL) error. As described above, because an analog voltage is a continuous signal and a digital code is a discrete value, the relationship between digital output codes of an ADC and an analog input voltage has a stair step shape. For a digital-to-analog converter (DAC), analog output voltages are determined based on digital input codes resulting in step increases in voltage from one digital code to the next. ADCs may include an internal DAC, and the linearity of such an internal DAC impacts the linearity of the ADC. The width of each step for an ADC is a function of the resolution of the ADC as well as component mismatches internal to the ADC, including components of a DAC that is internal to the ADC. As described further below, such component mismatches may result in DNL errors. The DNL error refers to the difference between an actual step width between successive digital codes and the step width of an ideal ADC (or difference between step heights between an actual and ideal DAC). The step width of an ideal ADC may be referred to as "1 LSB" (where "LSB" means least/less significant bit). DNL error may be expressed in units of LSB. For example, a +½ LSB DNL error means that the step width is 50% larger than the ideal ADC step width.

While the relationship between the analog input and the digital output codes is linear for an ideal ADC, DNL errors result in a non-linear relationship between the analog input and the digital output codes. It is thus useful to reduce DNL errors in an ADC.

Examples of this description address the foregoing with an oversampled successive-approximation-register (SAR) ADC, in which a sampling speed of the ADC is greater than (e.g., a sampling period of the ADC is less than) a system timing constraint for the analog input voltage. In an oversampled ADC, the analog input voltage is sampled by the ADC at a rate higher than a minimum sampling rate (e.g., a Nyquist sampling rate). For example, when using an n-bit ADC without oversampling, an input signal of 100 Hertz (Hz) is sampled at 200 Hz (e.g., at least the Nyquist sampling rate, which is equal to 2×100 Hz) to provide a digital output code of the ADC. However, when oversampling with a factor of k=4, for example, the same 100-Hz input signal is sampled at 800 Hz (e.g., k×2×100 Hz). In this example, k=4 is referred to as an oversampling ratio or oversampling factor. In some examples, an output of the ADC may be a sum of the resultant digital codes for the k samples, while in other examples, an output of the ADC may be an average of the resultant digital codes for the k samples.

Irrespective of the particular oversampling ratio of the SAR ADC, the ADC also includes a feedback DAC that provides portions of the successive approximation functionality of the binary search implemented by the SAR ADC. In general, the feedback DAC provides a DAC output voltage (e.g., an analog output) responsive to an n-bit digital code input. The specific functionality of the feedback DAC is described in further detail below. However, in examples of this description, the feedback DAC includes both a resistive DAC (RDAC) and a capacitive DAC (CDAC). The RDAC and CDAC are in a cascaded arrangement, in which the RDAC provides an intermediate DAC voltage as its output, which is responsive to the (n−m) LSBs of the n-bit digital code. In the cascaded arrangement, the CDAC provides the DAC output voltage as its output, which is responsive to the intermediate DAC voltage from the RDAC and to the m most-significant bits (MSBs) of the n-bit digital code.

In some examples, the oversampling ratio of the SAR ADC is $2^m$ (e.g., $k=2^m$). A conversion phase of the ADC includes $2^m$ conversion sub-phases. In each conversion sub-phase, the ADC provides an intermediate digital code, and the output of the ADC is based on the intermediate digital codes from the $2^m$ conversion sub-phases. For example, the output of the ADC may be a sum of the intermediate digital codes from the $2^m$ conversion sub-phases, or the output of the ADC may be an average of the intermediate digital codes from the $2^m$ conversion sub-phases.

In the examples described below, the CDAC includes $2^m$ capacitors. Ideally, the $2^m$ capacitors have equal capacitances. However, as explained above, component mismatches are possible in real-world applications, which may result in a DNL error (or an increase in magnitude of a DNL error). To address the DNL error introduced or exacerbated by component mismatches of the CDAC, the CDAC includes rotation logic that is configured to provide the intermediate DAC voltage from the RDAC to a different one of the $2^m$ capacitors in each of the $2^m$ conversion sub-phases.

In one example, m=2, and thus there are 4 conversion sub-phases and the CDAC includes 4 capacitors. In this example, during a first conversion sub-phase, the rotation logic is configured to provide the intermediate DAC voltage from the RDAC to a first capacitor of the CDAC. During a second conversion sub-phase, the rotation logic is configured to provide the intermediate DAC voltage from the RDAC to a second capacitor of the CDAC. During a third conversion sub-phase, the rotation logic is configured to provide the intermediate DAC voltage from the RDAC to a third capacitor of the CDAC. Finally, during the fourth conversion sub-phase, the rotation logic is configured to provide the intermediate DAC voltage from the RDAC to a fourth capacitor of the CDAC.

As described further below, the rotation logic of the CDAC may be additionally configured to control the remaining capacitors of the CDAC (e.g., the $2^m-1$ capacitors other than the capacitor to which the intermediate DAC voltage is provided) in a rotating fashion as well. For example, the capacitors in the CDAC may be coupled to a reference voltage source or a ground terminal based on various control signals (e.g., $2^m-1$ control signals). Continuing the above example in which m=2, there are thus 3 control signals. In this example, during the first conversion sub-phase, the rotation logic is configured to control the coupling of the second capacitor with the first control signal. During the second conversion sub-phase, the rotation logic is configured to control the coupling of the third capacitor with the first control signal. During the third conversion sub-phase, the rotation logic is configured to control the coupling of the fourth capacitor with the first control signal. Finally, during the fourth conversion sub-phase, the rotation logic is configured to control the coupling of the first capacitor with the first control signal. The rotation logic is similarly configured to apply the other control signals in a rotating fashion, which is described further below.

As described above, the output of the ADC may be a sum (or an average) of the intermediate digital codes from the $2^m$ conversion sub-phases. By rotating the control signals for the CDAC capacitors, as well as the capacitor to which the intermediate DAC voltage from the RDAC is provided for each of the $2^m$ conversion sub-phases, component mismatches that may be present in the capacitors of the CDAC are effectively cancelled out in the output of the ADC. Reducing the impact of the component mismatches present in the CDAC also reduces the DNL error of the ADC, which is useful as described above. These and other examples are described further below, with reference made to the accompanying figures.

FIG. 1 is a schematic block diagram of a device 100, which is an analog-to-digital converter (ADC) 100, in accordance with various examples. Particularly, the ADC 100 is a SAR ADC 100, although it is referred to simply as an ADC 100 below for the purpose of brevity. The ADC 100 is depicted in schematic fashion, and particular circuit implementations of various functional blocks may differ from that which is shown in the figures. The ADC 100 is configured to receive an analog input voltage (VIN) as an input and to provide a digital code as an output. The digital code output may generally be an n-bit digital code (e.g., (ADC_DATA_OUT[n−1:0]).

The ADC 100 includes a comparator 102 that has a non-inverting input (+), an inverting input (−), and a comparator output (COMP OUT). In the example of FIG. 1, the ADC 100 includes a sample/hold circuit 104 that is configured to receive (e.g., sample) the analog input voltage and provide a stable output voltage (e.g., hold) that corresponds to the analog input voltage. The output of the sample/hold circuit 104 is provided to the non-inverting input of the comparator 102 in this example.

The ADC 100 also includes a DAC 106 that is configured to provide a DAC output voltage. The output of the DAC 106 is provided to the inverting input of the comparator 102. The DAC 106 is described further below.

The ADC 100 includes a SAR circuit 108, which includes a register (e.g., a SAR) that is configured to store an n-bit digital code. The SAR circuit 108 is coupled to, and thus configured to receive, the comparator 102 output. The n-bit digital code stored in the SAR circuit 108 is initialized to an initial value at a beginning of a conversion phase of the ADC 100, which facilitates implementation of a binary search algorithm (e.g., a successive approximation binary search). For example, the n-bit digital code stored in the SAR may be initialized to have a MSB (most/more significant bit) of 1 followed by all 0s (e.g., 10 . . . 0).

The SAR circuit 108 is configured to provide the n-bit digital code stored in the SAR circuit 108 as an output. The SAR circuit 108 is also configured to update the n-bit digital code stored in the SAR responsive to a value of the comparator 102 output. The output of the ADC 100 is based on the n-bit digital code stored in the SAR circuit 108 at the end of the conversion phase.

The n-bit digital code stored in the SAR circuit 108 is provided to the DAC 106 (e.g., DAC_DATA_IN[n−1:0]), which is configured to convert the received n-bit digital code to an analog voltage, and to provide the resultant analog voltage as the DAC 106 output voltage. A reference voltage generator 110 provides a reference voltage (VREF), which may be a full-scale voltage, to the DAC 106. The DAC 106 uses the reference voltage to convert the n-bit digital code to the DAC 106 output voltage.

The comparator 102 effectively compares the analog input voltage (VIN) to the output of the DAC 106, and provides the result of the comparison to the SAR circuit 108. The SAR circuit 108 provides the n-bit digital code as an approximate digital code of VIN to the DAC 106. The DAC 106, in turn, provides to the comparator 102 an analog voltage that represents the approximate digital code from the SAR circuit 108.

As explained above, the SAR circuit 108 may be initialized to store an n-bit digital code having a MSB equal to 1 followed by all 0s. Accordingly, the DAC 106 initially provides to the comparator 102 an analog voltage equivalent of the n-bit digital code from the SAR circuit 108 (e.g., 10 . . . 0), which may be VREF/2 for example. The comparator 102 compares the voltage from the DAC 106 with the analog input voltage (VIN). Accordingly, if VIN>VREF/2, the output of the comparator 102 is asserted (e.g., the output goes "high"); if VIN<VREF/2, the output of the comparator 102 is de-asserted (e.g., the output goes "low"). The SAR circuit 108 is configured to set the MSB-1 bit responsive to the output of the comparator 102. For example, following initialization, if the output of the comparator 102 is asserted, the SAR circuit 108 updates the MSB-1 bit of the n-bit digital code to be 1; if the output of the comparator 102 is de-asserted, the SAR circuit 108 updates the second-MSB of the of the n-bit digital code to be 0. This binary search cycle repeats until every bit of the n-bit digital code stored in the SAR circuit 108 has been tested. When all n bits of the n-bit digital code stored in the SAR circuit 108 have been tested, the conversion phase (or sub-phase) ends, and the n-bit digital code stored in the SAR circuit 108 is the output of the ADC 100.

Figure 2:
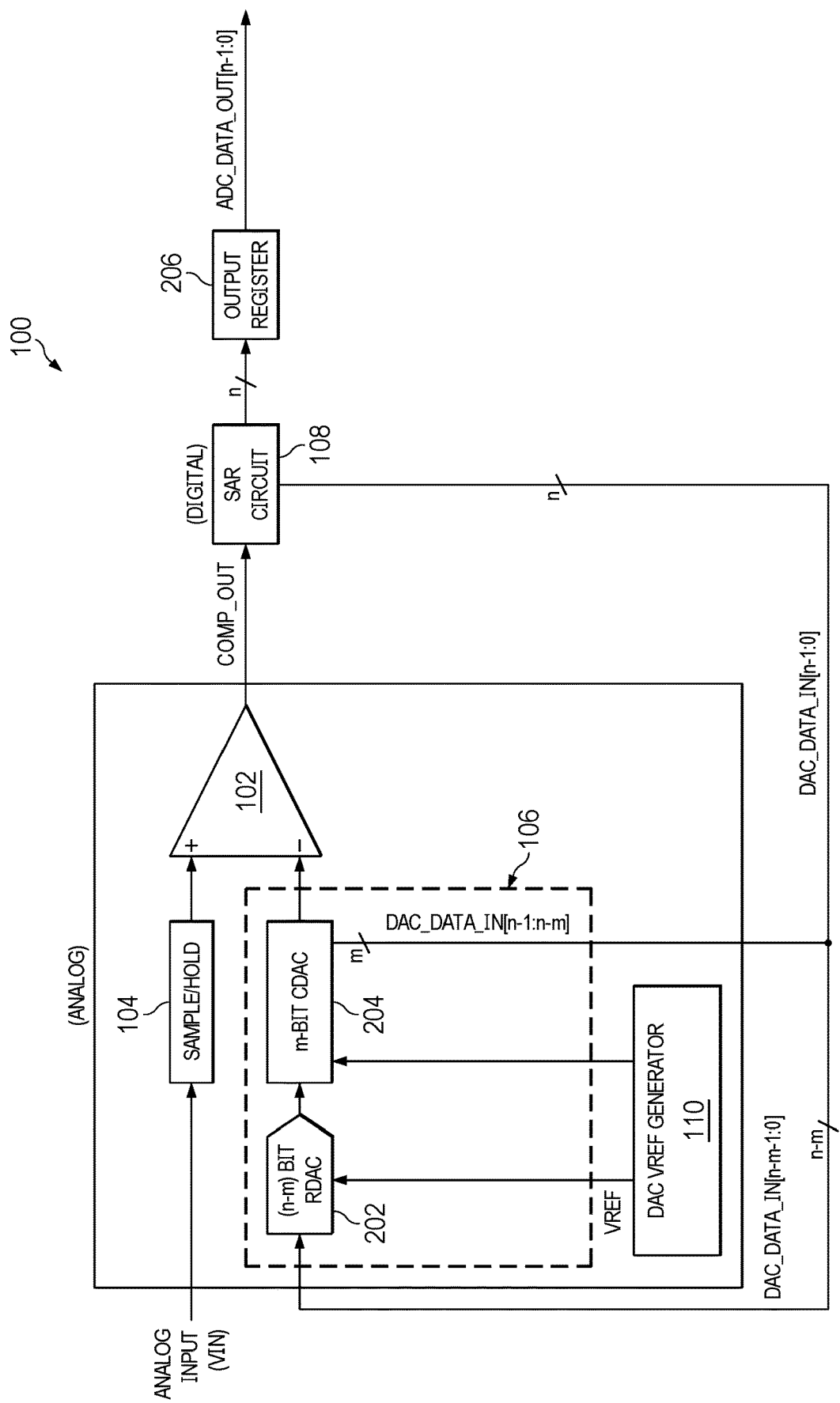
FIG. 2 is a schematic block diagram of the ADC of FIG. 1, in which a feedback digital-to-analog converter (DAC) is implemented as a combination of a resistive DAC and a capacitive DAC in accordance with various examples.

FIG. 2 is a schematic block diagram of the ADC 100 of FIG. 1, in which the feedback DAC 106 is implemented as a combination of an RDAC 202 and a CDAC 204 in accordance with various examples. In FIG. 2, elements that are like-numbered with those in FIG. 1 have the same general functions described above with respect to FIG. 1, and additional elements and features thereof, which are specific to FIG. 2, are described below.

The RDAC 202 may be a resistive ladder-based RDAC, while the CDAC 204 is described in further detail below. As described above, the DAC 106 is an n-bit DAC, and the SAR circuit 108 is configured to provide its stored n-bit digital code as output to DAC 106 (where, for example, m-bits go to CDAC 204 and n−m bits go to RDAC 202). The CDAC 204 is an m-bit CDAC, while the RDAC 202 is an (n−m)-bit RDAC. Accordingly, of the n-bit digital code from the SAR circuit 108, the (n−m) LSBs (e.g., DAC_DATA_IN[n−m−1:0]) are provided to the RDAC 202, while the m-bit MSBs (e.g., DAC_DATA_IN[n−1:n−m]) are provided to the CDAC 204. In some examples, m may be greater than 0, and m may be less than n (e.g., 0<m<n, where m and n are integer values).

Also, as described above, the RDAC 202 and the CDAC 204 are in a cascaded arrangement, in which the RDAC 202 output is an intermediate DAC voltage that is provided to the CDAC 204 as an input.

The RDAC 202 provides the intermediate DAC voltage responsive to the received (n−m) LSBs of the n-bit digital code from the SAR circuit 108, and to VREF from the reference voltage generator 110. In particular, the RDAC 202 is configured to convert DAC_DATA_IN[n−m−1:0] to an analog voltage, and to provide the resultant analog voltage as the intermediate DAC voltage. The RDAC 202 also uses VREF to convert DAC_DATA_IN[n−m−1:0] to the intermediate DAC voltage.

In the cascaded arrangement shown in FIG. 2, the CDAC 204 provides the DAC 106 output voltage as its output, which is responsive to the intermediate DAC voltage from the RDAC 202, to the m-bit MSBs of the n-bit digital code from the SAR circuit 108, and to VREF from the reference voltage generator 110.

Accordingly, in the cascaded arrangement shown in FIG. 2, the (n−m)-bit LSBs of the n-bit digital code from the SAR circuit 108 are resolved by the RDAC 202, while the m-bit MSBs of the n-bit digital code from the SAR circuit 108 are resolved by the CDAC 204. In FIG. 2, the overall functionality of the DAC 106 is as described above with respect to FIG. 1, with that functionality provided by the cascaded arrangement of the RDAC 202 and the CDAC 204.

As described above, in some examples, an oversampling ratio of the ADC 100 is $2^m$ (e.g., $k=2^m$). A conversion phase of the ADC 100 thus includes $2^m$ conversion sub-phases. At the end of each conversion sub-phase (e.g., when all n bits of the n-bit digital code stored in the SAR circuit 108 have been tested), the n-bit digital code stored in the SAR circuit 108 is provided to an output register 206. The output of the SAR circuit 108 at the end of each conversion sub-phase may be referred to as an intermediate digital code, and thus the output register 206 is configured to store $2^m$ intermediate digital codes corresponding to the $2^m$ conversion sub-phases.

The output of the ADC 100 is based on the intermediate digital codes stored in the output register 206 after the last conversion sub-phase (e.g., the fourth conversion sub-phase, when m=2). Continuing the example where m=2, the output of the ADC 100 may be a sum of the four intermediate digital codes stored in the output register 206, or the output of the ADC 100 may be an average of the four intermediate digital codes stored in the output register 206.

The oversampled ADC 100 described herein reduces DNL error in one or more ways. First, in some examples, the cascaded arrangement of the DAC 106 in FIG. 2 results in a linearity requirement of the RDAC 202 being reduced by a factor of $2^m$, which reduces the DNL error of the ADC 100. Second, as described further below, the CDAC 204 includes rotation logic that is configured to rotate the control signals for the capacitors in the CDAC 204, as well as to rotate the capacitor of the CDAC 204 to which the intermediate DAC voltage from the RDAC 202 is provided for each of the $2^m$ conversion sub-phases. Accordingly, component mismatches that may be present in the capacitors of the CDAC 204 are effectively cancelled out in the output of the ADC 100, which in turn further reduces the DNL error of the ADC 100.

Figure 3:
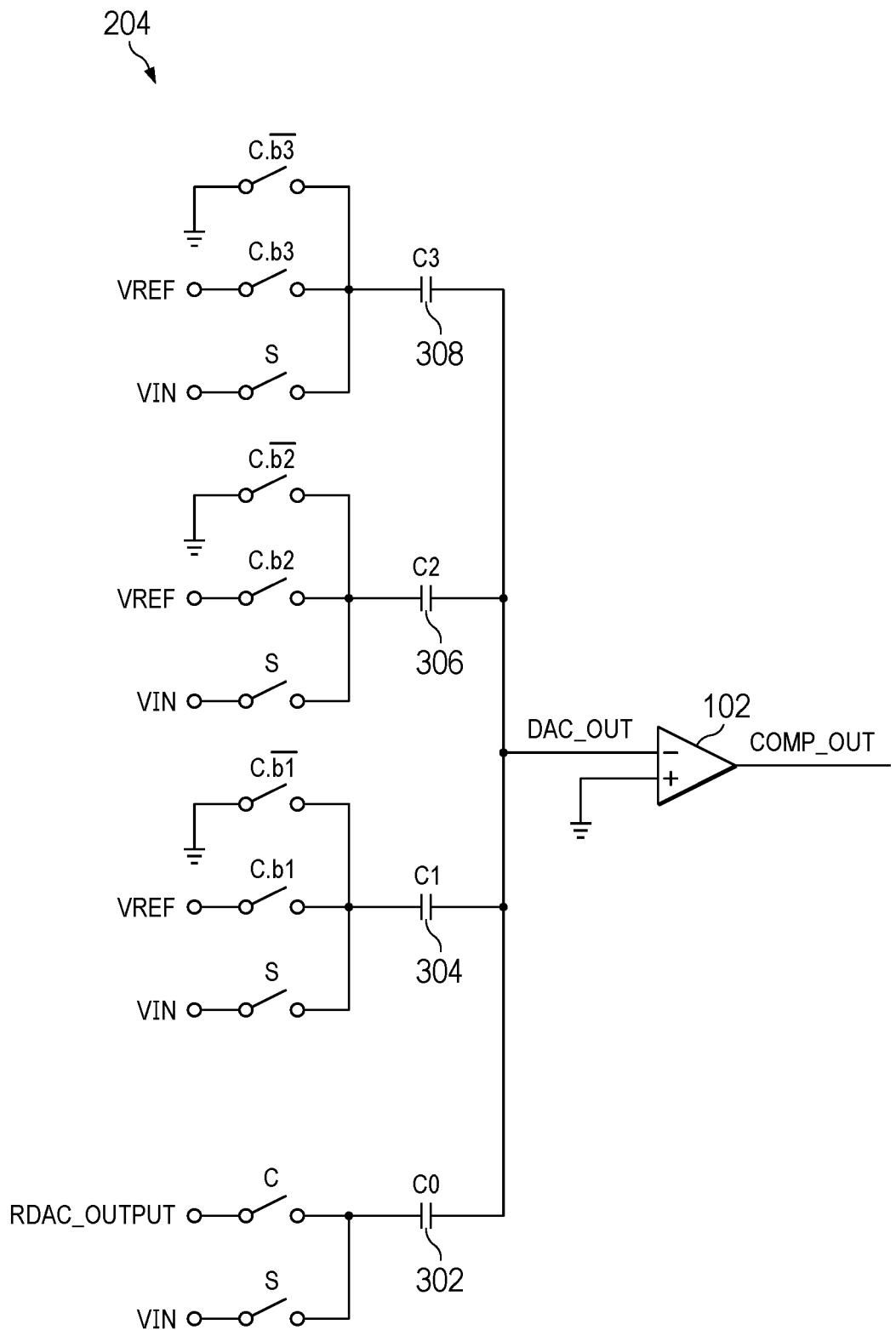
FIG. 3 is a schematic circuit diagram of the capacitive DAC of FIG. 2 in accordance with various examples.
Figure 4:
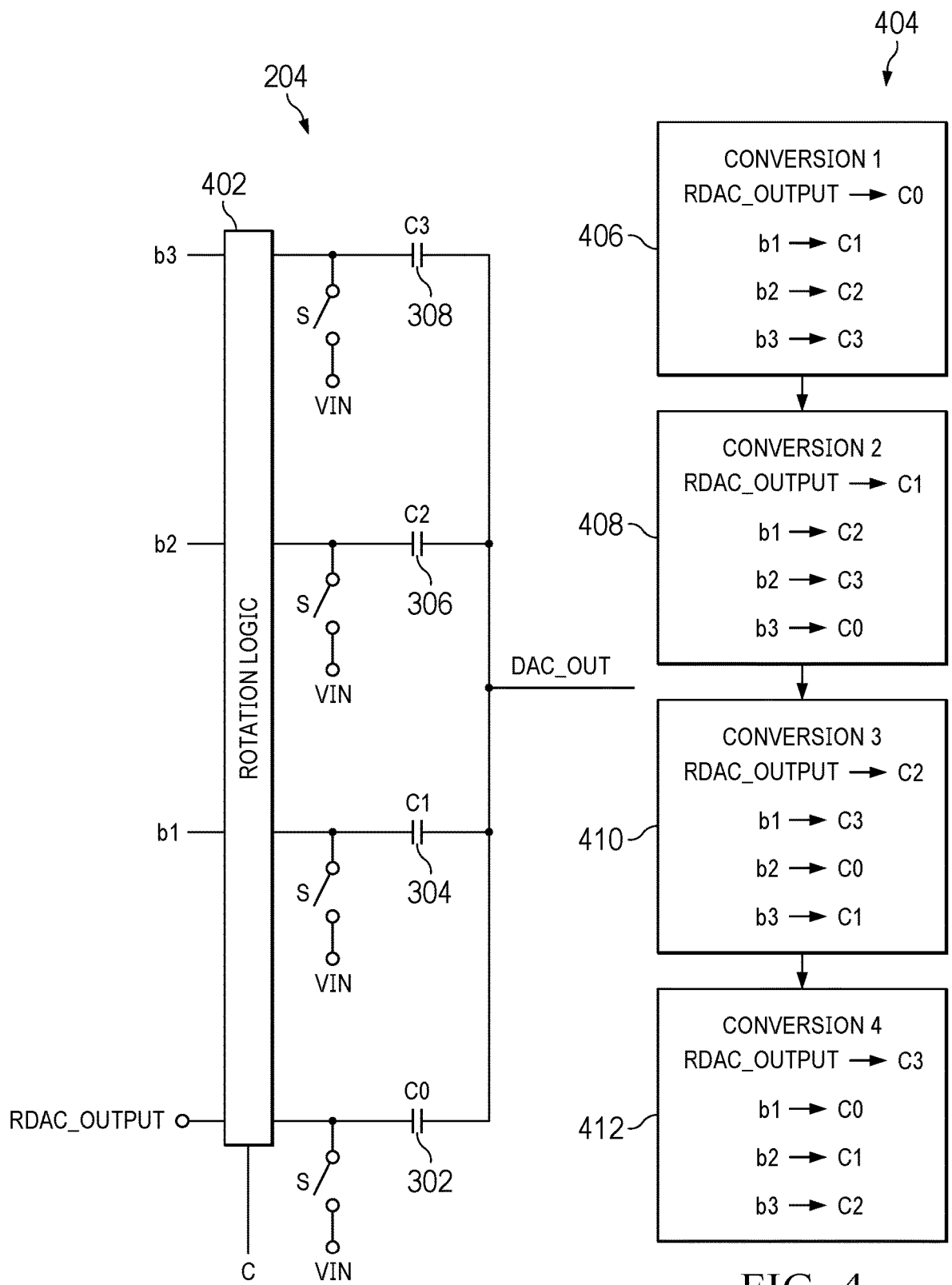
FIG. 4 is a schematic circuit diagram of the capacitive DAC of FIG. 2 including rotation logic in accordance with various examples.

FIG. 3 is a schematic circuit diagram of the CDAC 204 of FIG. 2 in accordance with various examples. In FIG. 3, the CDAC 204 is depicted without the rotation logic described above in order to introduce the general functionality of the CDAC 204. FIG. 4, described below, shows the CDAC 204 including rotation logic 402 in accordance with various examples.

In the example of FIG. 3, m=2, and thus the CDAC 204 includes four capacitors: a first capacitor 302, a second capacitor 304, a third capacitor 306, and a fourth capacitor 308, which may be unit capacitors (e.g., having equal rated capacitances). The capacitors 302, 304, 306, 308 may alternately be referred to as C0, C1, C2, C3, respectively. In this example, the DNL error of the ADC 100 is dependent on matching between the unit capacitors 302, 304, 306, 308.

Also, for the purpose of explanation, n=12 in this example, and thus the CDAC 204 receives DAC_DATA_IN[11:10] from the SAR circuit 108.

During a sample phase, a signal S is asserted (e.g., has a logic "high" or logic "1" value so as to render the switch "closed" or conducting), which causes each of the capacitors 302, 304, 306, 308 to be coupled an input voltage node of the ADC 100, and thus charged to the analog input voltage VIN. This effectively functions as the sample/hold circuit 104 shown schematically in FIGS. 1 and 2, as will be explained further below. The conversion phase of the ADC 100 begins following the sample phase, at which time the signal S is de-asserted (e.g., has a logic "low" or logic "0" value so as to render the switch "open" or non-conducting), and the capacitors 302, 304, 306, 308 are decoupled from the input voltage node of the ADC 100. Also, during the conversion phase, a signal C is asserted. The signals S and C may be generated internal to the ADC 100, such as by the SAR circuit 108.

As described above, the intermediate DAC voltage from the RDAC 202 is provided to one of the capacitors of the CDAC 204, which is the first capacitor 302 in FIG. 3. That is, the capacitor 302 receives the RDAC 202 output because the signal C is asserted during the conversion phase. The remaining capacitors 304, 306, 308 are either coupled to the reference voltage generator 110 (e.g., to receive VREF) or to a ground terminal based on various control signals.

In particular, the CDAC 204 is configured to derive 3 control signals (e.g., $2^m-1$) from the m-bit MSBs of the n-bit digital code from the SAR circuit 108 (e.g., DAC_DATA_IN [11:10]). In FIG. 3, the control signals are b1, b2, and b3 (illustrated in FIG. 3 as C.b1, C.b2 and C.b3, respectively). The control signals may be thermometric-decoded values. For example:

b1=DAC_DATA_IN[11]+DAC_DATA_IN[10];
b2=DAC_DATA_IN[11]; and
b3=DAC_DATA_IN[11].DAC_DATA_IN[10], Where '+' indicates a logical OR operation and '.' indicates a logical AND operation.

Accordingly, the capacitors 304, 306, 308 are either coupled to the reference voltage generator 110 or to the ground terminal based on the input code DAC_DATA_IN [11:10] from the SAR circuit 108.

As explained above, the SAR circuit 108 may be initialized to store an n-bit digital code having an MSB equal to 1. Accordingly, the CDAC 204 initially receives DAC_ DATA_IN[11:10] equal to 0b10. Initially then, b1 is asserted (e.g., 1 OR 0 is 1) and the capacitor 304 (e.g., the bottom plate thereof) is coupled to the reference voltage generator 110, b2 is asserted (e.g., DAC_DATA_IN[11] is 1) and the capacitor 306 (e.g., the bottom plate thereof) is coupled to the reference voltage generator 110, while b3 is de-asserted (e.g., 1 AND 0 is 0) and the capacitor 308 (e.g., the bottom plate thereof) is coupled to the ground terminal. Further, because DAC_DATA_IN[9:0] is initially all 0s, the intermediate DAC voltage from the RDAC 202 is also the ground terminal voltage, and thus the capacitor 302 (e.g., the bottom plate thereof) is effectively coupled to the ground terminal. Accordingly, during conversion, the top plates of the capacitors 302, 304, 306, 308 are floating such that when the bottom plate is coupled to either the reference voltage generator 110 or the ground terminal, the top plates are biased accordingly because there is no change in net charge on the respective capacitor. The net voltage at the DAC_OUT terminal is thus VREF/2−VIN (ignoring any parasitic capacitance(s) for simplicity) based on the initialized value of DAC_DATA_IN[11:10].

As a result, when VIN>VREF/2, the DAC_OUT terminal in FIG. 3 has a negative voltage, and thus the output of the comparator 102 is asserted. When VIN<VREF/2, the DAC_OUT terminal has a positive voltage, and thus the output of the comparator 102 is de-asserted. In this way, the capacitors 302, 304, 306, 308 perform the function of the sample/hold circuit 104 of FIGS. 1 and 2, and the comparator 102 functionality is achieved by the example single-ended coupling shown in FIG. 3, in which the DAC_OUT terminal is coupled to the inverting input of the comparator 102, while the non-inverting input of the comparator 102 is coupled to the ground terminal. Irrespective of the particular implementation of the comparator 102, however, the comparator 102 provides its output based on a comparison of VIN to the DAC 106 output voltage.

As described above, the SAR circuit 108 is configured to set the MSB-1 bit responsive to the output of the comparator 102. For example, following initialization, if the output of the comparator 102 is asserted, the SAR circuit 108 updates DAC_DATA_IN[10] to be 1; if the output of the comparator 102 is de-asserted, the SAR circuit 108 updates DAC_DATA_IN[10] to be 0.

A SAR binary search algorithm continues to be implemented as described above, with the SAR circuit 108 setting progressively-less significant bits of the DAC_DATA_IN digital code in each iteration until all n bits of the DAC_DATA_IN digital code have been determined. The CDAC 204 output is the DAC 106 output, which is based on the intermediate DAC voltage from the RDAC 202 (e.g., RDAC_OUTPUT), which is in turn based on DAC_DATA_IN[9:0].

In the example of FIG. 3, the CDAC 204 is implemented in a single-ended manner because the comparator 102 compares the voltage at the DAC_OUT terminal to the voltage at the ground terminal. However, in other examples, the CDAC 204 may be implemented in a pseudo-differential manner by coupling the non-inverting input of the comparator 102 to the output of a second CDAC (not shown for simplicity), which is coupled to the ground terminal (or a common mode terminal) in the sample phase (e.g., when the S signal is asserted), and to the ground terminal during the conversion phase (e.g., when the C signal is asserted). The pseudo-differential implementation may improve CDAC performance, such as in the presence of non-idealities including clock-feedthrough and switch charge injection. In still other examples, the CDAC 204 may be implemented in a fully-differential manner by coupling the non-inverting input of the comparator 102 to the output of a second DAC, which may be a mirror-image of the DAC 106, but that receives a negative reference voltage (e.g., −VREF). In this example, the SAR circuit 108 may be modified to include logic that allows for the output code being a negative value.

FIG. 4 is a schematic circuit diagram of the CDAC 204 of FIGS. 2 and 3, including rotation logic 402 in accordance with various examples. The rotation logic 402 is configured to provide the intermediate DAC voltage from the RDAC 202 (e.g., RDAC_OUTPUT) to a different one of the capacitors 302, 304, 306, 308 in each of the four conversion sub-phases (e.g., in the depicted example in which m=2). The rotation logic 402 is also configured to control the coupling of the remaining capacitors of the CDAC 204 (e.g., the $2^m-1$ capacitor(s) other than the capacitor to which the intermediate DAC voltage is provided). For example, the rotation logic 402 may be configured to control a coupling of each of the remaining capacitors of the CDAC 204 with a different one of the control signals (e.g., b1, b2, b3) in each of the four conversion sub-phases.

In FIG. 4, certain elements have been simplified for ease of depiction. For example, the specific couplings of the capacitors 302, 304, 306, 308 to either the reference voltage generator 110 (e.g., VREF) or the ground node are removed relative to FIG. 3. However, the control signals b1, b2, b3 may be applied in a similar manner as described with respect to FIG. 3 (e.g., when b1/b2/b3 is asserted, an associated capacitor is coupled to the reference voltage generator 110, and when b1/b2/b3 is de-asserted, the associated capacitor is coupled to the ground terminal).

The rotation logic 402 may be configured to implement a rotation algorithm 404 in one example. The rotation logic 402 is not necessarily limited to the particular rotation algorithm 404; rather, the rotation algorithm 404 is one such example that may be implemented by the rotation logic 402.

Referring to the rotation algorithm 404, and continuing the example in which m=2, there are four conversion sub-phases. In the first conversion sub-phase, represented by block 406, the rotation logic 402 is configured to provide the intermediate DAC voltage to the first capacitor 302.

Also, during the first conversion sub-phase, the rotation logic 402 is configured to control the coupling of the second capacitor 304 with the first control signal b1. For example, if b1 is asserted, the second capacitor 304 is coupled to the reference voltage generator 110, and if b1 is de-asserted, the second capacitor 304 is coupled to the ground terminal.

During the first conversion sub-phase, the rotation logic 402 is further configured to control the coupling of the third capacitor 306 with the second control signal b2. For example, if b2 is asserted, the third capacitor 306 is coupled to the reference voltage generator 110, and if b2 is de-asserted, the third capacitor 306 is coupled to the ground terminal.

During the first conversion sub-phase, the rotation logic 402 is also configured to control the coupling of the fourth capacitor 308 with the third control signal b3. For example, if b3 is asserted, the fourth capacitor 308 is coupled to the reference voltage generator 110, and if b3 is de-asserted, the fourth capacitor 308 is coupled to the ground terminal.

In the second conversion sub-phase, represented by block 408, the rotation logic 402 is configured to provide the intermediate DAC voltage to the second capacitor 304.

Also, during the second conversion sub-phase, the rotation logic 402 is configured to control the coupling of the third capacitor 306 with the first control signal b1. For example, if b1 is asserted, the third capacitor 306 is coupled to the reference voltage generator 110, and if b1 is de-asserted, the third capacitor 306 is coupled to the ground terminal.

During the second conversion sub-phase, the rotation logic 402 is further configured to control the coupling of the fourth capacitor 308 with the second control signal b2. For example, if b2 is asserted, the fourth capacitor 308 is coupled to the reference voltage generator 110, and if b2 is de-asserted, the fourth capacitor 308 is coupled to the ground terminal.

During the second conversion sub-phase, the rotation logic 402 is also configured to control the coupling of the first capacitor 302 with the third control signal b3. For example, if b3 is asserted, the first capacitor 302 is coupled to the reference voltage generator 110, and if b3 is de-asserted, the first capacitor 302 is coupled to the ground terminal.

In the third conversion sub-phase, represented by block 410, the rotation logic 402 is configured to provide the intermediate DAC voltage to the third capacitor 306.

Also, during the third conversion sub-phase, the rotation logic 402 is configured to control the coupling of the fourth capacitor 308 with the first control signal b1. For example, if b1 is asserted, the fourth capacitor 308 is coupled to the reference voltage generator 110, and if b1 is de-asserted, the fourth capacitor 308 is coupled to the ground terminal.

During the third conversion sub-phase, the rotation logic 402 is further configured to control the coupling of the first capacitor 302 with the second control signal b2. For example, if b2 is asserted, the first capacitor 302 is coupled to the reference voltage generator 110, and if b2 is de-asserted, the first capacitor 302 is coupled to the ground terminal.

During the third conversion sub-phase, the rotation logic 402 is also configured to control the coupling of the second capacitor 304 with the third control signal b3. For example, if b3 is asserted, the second capacitor 304 is coupled to the reference voltage generator 110, and if b3 is de-asserted, the second capacitor 304 is coupled to the ground terminal.

In the fourth conversion sub-phase, represented by block 412, the rotation logic 402 is configured to provide the intermediate DAC voltage to the fourth capacitor 308.

Also, during the fourth conversion sub-phase, the rotation logic 402 is configured to control the coupling of the first capacitor 302 with the first control signal b1. For example, if b1 is asserted, the first capacitor 302 is coupled to the reference voltage generator 110, and if b1 is de-asserted, the first capacitor 302 is coupled to the ground terminal.

During the fourth conversion sub-phase, the rotation logic 402 is further configured to control the coupling of the second capacitor 304 with the second control signal b2. For example, if b2 is asserted, the second capacitor 304 is coupled to the reference voltage generator 110, and if b2 is de-asserted, the second capacitor 304 is coupled to the ground terminal.

During the fourth conversion sub-phase, the rotation logic 402 is also configured to control the coupling of the third capacitor 306 with the third control signal b3. For example, if b3 is asserted, the third capacitor 306 is coupled to the reference voltage generator 110, and if b3 is de-asserted, the third capacitor 306 is coupled to the ground terminal.

As described above, the output of the ADC 100 may be a sum (or an average) of the intermediate digital codes that result from the four (e.g., $2^m$) conversion sub-phases. Because the rotation logic 402 rotates the control signals for the CDAC 204 capacitors, as well as the capacitor to which the intermediate DAC voltage from the RDAC 202 is provided, for each of the $2^m$ conversion sub-phases, component mismatches that may be present in the capacitors of the CDAC 204 are effectively cancelled out in the output of the ADC 100. Reducing the impact of the component mismatches present in the CDAC also reduces the DNL error of the ADC 100, which is useful as described above.

Figure 5:
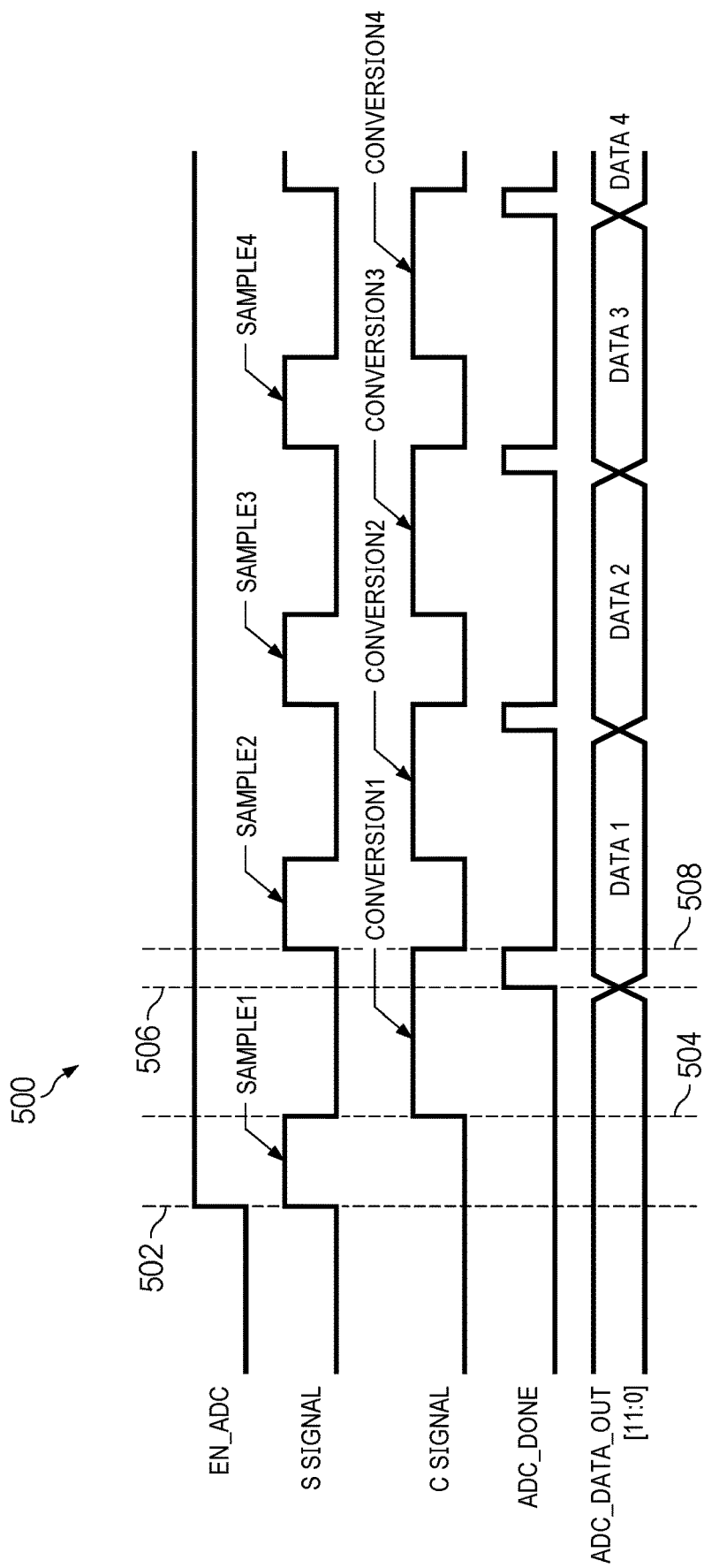
FIG. 5 is a graph of waveforms of operation of the ADC of FIG. 2 in a conversion phase that includes multiple conversion sub-phases in accordance with various examples.

FIG. 5 is a graph 500 of waveforms of operation of the ADC 100 of FIG. 2 in accordance with various examples. In the example of FIG. 5, m=2 as above, and thus there are four conversion sub-phases. In the graph 500, the EN_ADC waveform is an enable signal for the ADC 100 described above. The S signal and the C signal waveforms are of the S signal and C signal, which indicate the sample and conversion phases, respectively. The ADC_DONE waveform is a conversion done signal, which indicates when a conversion phase (or sub-phase) is complete, and, thus, the n-bit digital code of the SAR circuit 108 represents the determined digital code that corresponds to the analog input voltage VIN. Finally, the ADC_DATA_OUT waveform indicates when the resultant n-bit digital code from a conversion sub-phase is determined (e.g., the intermediate digital code for that sub-phase), and thus stored in the output register 206. For example, DATA1 is the n-bit digital code that results from the first conversion sub-phase, DATA2 is the n-bit digital code that results from the second conversion sub-phase, DATA3 is the n-bit digital code that results from the third conversion sub-phase, and DATA4 is the n-bit digital code that results from the fourth conversion sub-phase.

In the graph 500, at time 502, the enable signal for the ADC 100 is asserted and thus the S signal is asserted as well, which begins a first sample phase. The first sample phase continues from time 502 until time 504, at which point the analog input voltage VIN has been sampled (e.g., the capacitors 302, 304, 306, 308 are charged to VIN). At time 504, the S signal is de-asserted, which indicates the end of the sample phase. Also, the C signal is asserted, which indicates the beginning of the first conversion sub-phase. At the beginning of the first conversion sub-phase, the SAR circuit 108 may be initialized to store an n-bit digital code having an MSB equal to 1. The SAR binary search algorithm is implemented as described above with respect to FIGS. 3 and 4, with the SAR circuit 108 setting progressively-less significant bits of the DAC_DATA_IN digital code in each iteration until all n bits of the DAC_DATA_IN digital code have been determined.

In the graph 500, the time 506 indicates the time at which all n bits of the DAC_DATA_IN digital code have been determined in the first conversion sub-phase, and thus the ADC_DONE signal is asserted. As described above, at the end of a conversion sub-phase, the DAC_DATA_IN digital code corresponds to the intermediate digital code that is provided to the output register 206 for that sub-phase. Accordingly, an ADC_DATA_OUT value (e.g., DATA1) is also available at time 506, and is thus stored in the output register 206.

In the graph 500, at time 508, the C signal is de-asserted to indicate the end of the first conversion sub-phase and the S signal is again asserted, which begins a second sample phase, and the above described conversion process continues in a similar manner. The subsequent ADC_DATA_OUT values DATA2, DATA3, and DATA4 are the intermediate digital codes from the second, third, and fourth conversion sub-phases, respectively. The output of the ADC 100 may be a sum (or an average) of DATA1, DATA2, DATA3, and DATA4.

In the example of FIG. 5, a sample phase is included for each of the conversion sub-phases. However, in other examples, fewer sample phases (e.g., one sample phase before the first conversion sub-phase begins) may be implemented, which further increases the bandwidth of the ADC 100 because the four (e.g., $2^m$) conversion sub-phases can be completed in less time.

Figure 6A:
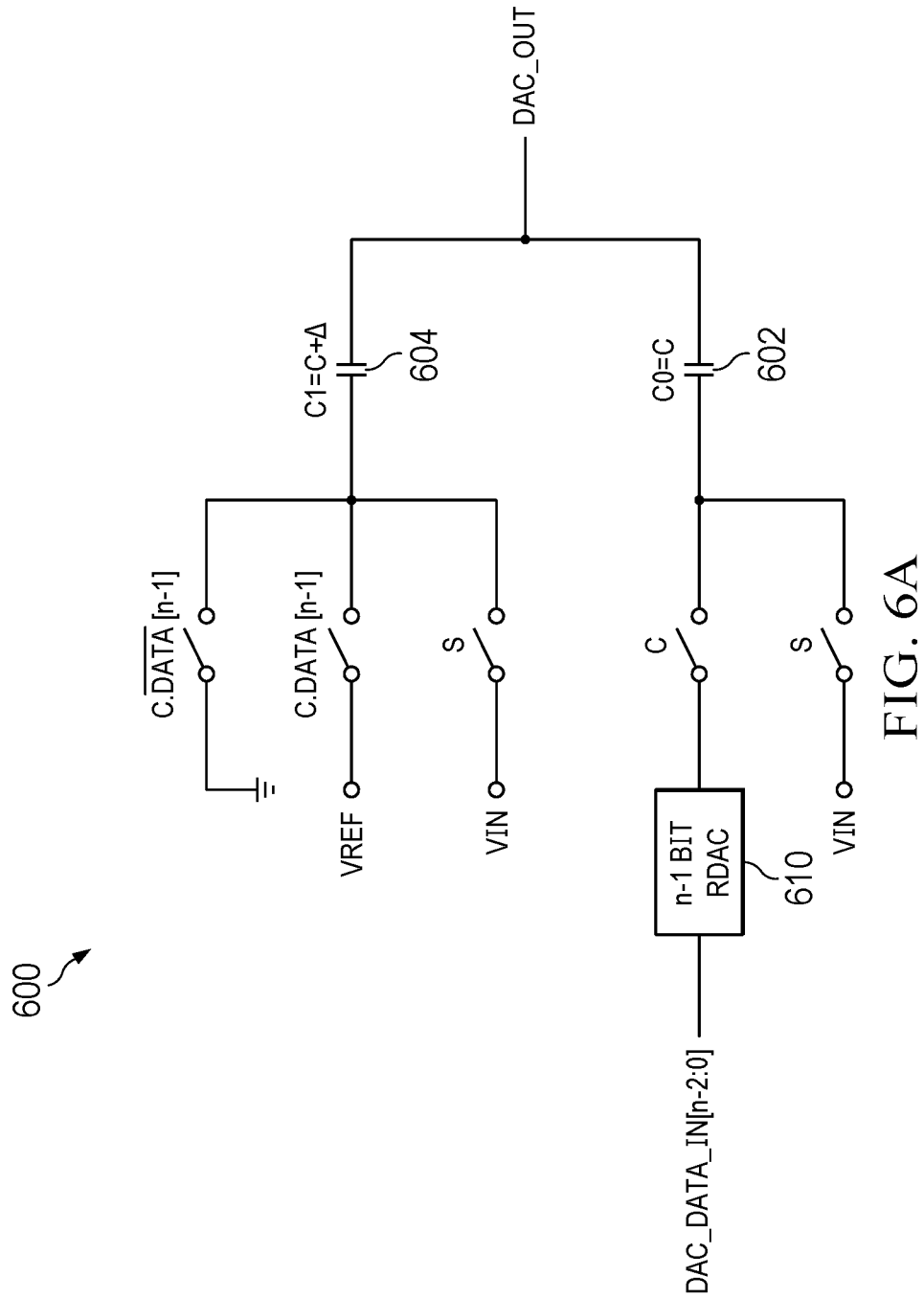
FIGS. 6A and 6B are schematic circuit diagrams of a 1-bit capacitive DAC that demonstrate a reduction in differential non-linearity errors that results from various examples of this description.
Figure 6B:
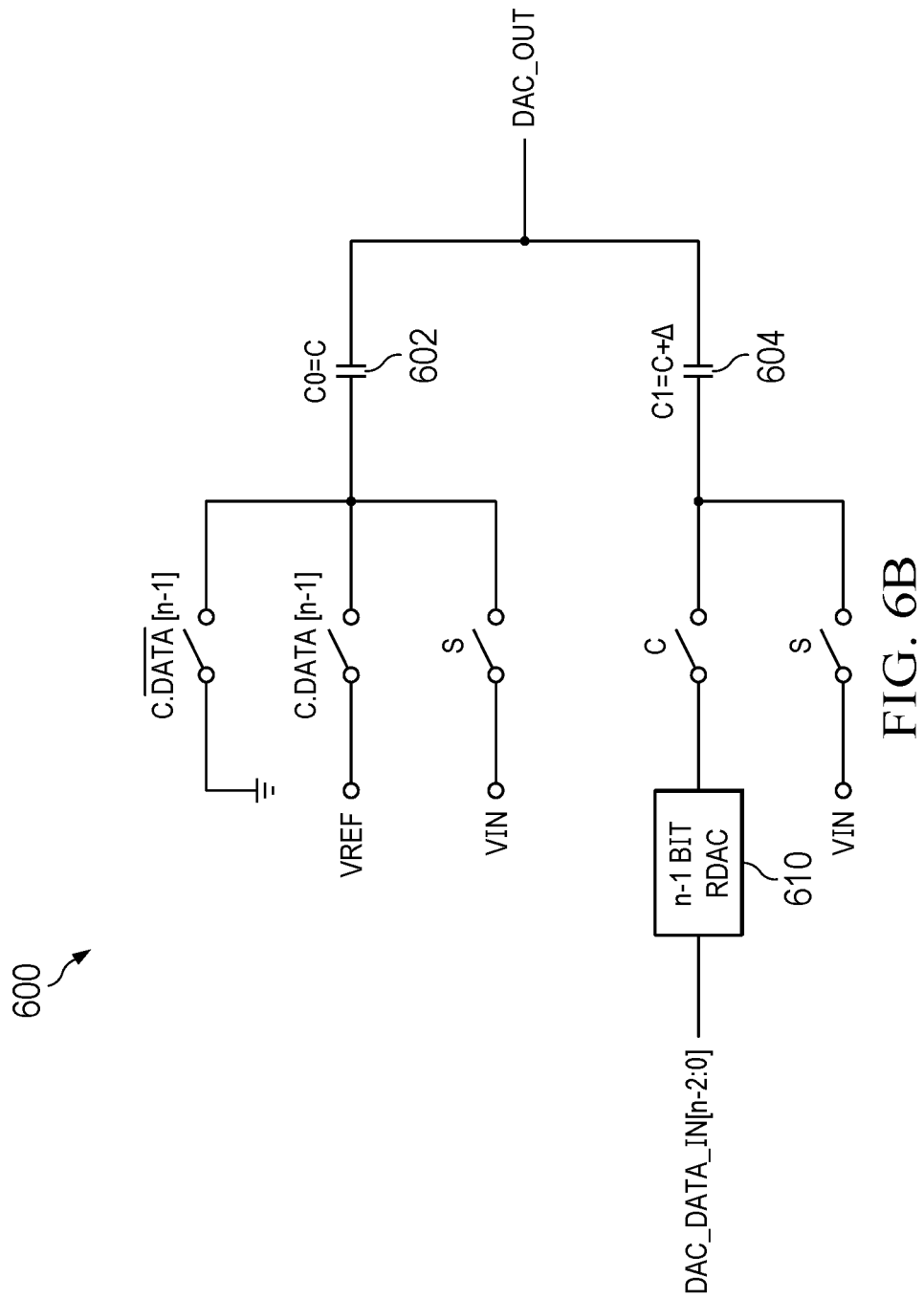

FIGS. 6A and 6B are schematic circuit diagrams of a 1-bit CDAC 600 that demonstrate a DNL error reduction that results from the examples described herein. The CDAC 600 is generally similar to the CDAC 204, described above, but for a simplified example in which m=1. Accordingly, the CDAC 600 includes two capacitors 602, 604. The capacitors 602, 604 may alternately be referred to as C0, C1, respectively. In the example of FIGS. 6A and 6B, the capacitor 602 has a capacitance of C, while the capacitor 604 has a capacitance of C+Δ. As described above, such component mismatches are a source of DNL error of a DAC internal to an ADC, and thus a source of DNL error for the ADC itself.

In FIGS. 6A and 6B, an (n−1)-bit RDAC 610 provides functionality similar to the RDAC 110 described above. For example, the RDAC 610 provides an intermediate DAC voltage responsive to the received (n−1) LSBs of the n-bit digital code from the SAR circuit 108, and to VREF from the reference voltage generator 110. In particular, the RDAC 610 is configured to convert DAC_DATA_IN[n−2:0] to an analog voltage, and to provide the resultant analog voltage as the intermediate DAC voltage.

FIG. 6A is an example of the CDAC 600 in the first conversion sub-phase, and FIG. 6B is an example of the CDAC 600 in the second conversion sub-phase. The sample phase is as described above, in which the signal S is asserted to charge the capacitors 602, 604 to the analog input voltage VIN. The rotation logic described above is not explicitly shown in FIGS. 6A and 6B, but the functionality implemented by the rotation logic in the conversion sub-phases is reflected by the various couplings of the capacitors 602, 604.

For example, during the first conversion sub-phase in FIG. 6A, the intermediate DAC voltage from the RDAC 610 is provided to the first capacitor 602 (e.g., because the signal C is asserted). Also, during the first conversion sub-phase, the second capacitor 604 is either coupled to the reference voltage generator 110 (e.g., to receive VREF) or to the ground terminal based on a control signal. In this simplified example, the control signal is DAC_DATA_IN[n−1] from the SAR circuit 108.

During the second conversion sub-phase in FIG. 6B, the intermediate DAC voltage from the RDAC 610 is provided to the second capacitor 604 (e.g., because the signal C is asserted). Also, during the second conversion sub-phase, the first capacitor 602 is either coupled to the reference voltage generator 110 (e.g., to receive VREF) or to the ground terminal based on DAC_DATA_IN[n−1] from the SAR circuit 108.

For the sake of explanation, it may be assumed that there is no component mismatch present in the RDAC 610. Under this assumption, a DNL error is introduced by the CDAC 600 when VIN transitions between values that result in an MSB transition in the ADC 100 output (and thus a transition in the DAC_DATA_IN MSB). For example, the DNL error occurs when VIN transitions from a first value that should result in a digital code of 0b01 . . . 1, to a second value that should result in a digital code of 0b10 . . . 0. This transition in VIN value is referred to as an "MSB transition" for simplicity.

When an MSB transition occurs in VIN, the CDAC 600 output value (DAC_OUT) should change by one LSB, which is $VREF/2^n$. However, because of the mismatch between the capacitor 602 (having capacitance C) and the capacitor 604 (having capacitance C+Δ), the actual magnitude of the DAC_OUT step in the first conversion sub-phase (FIG. 6A) is:

$$\frac{\Delta * VREF}{2C + \Delta} + \frac{C * VREF}{2^{n-1}[2C + \Delta]}$$

A resultant DNL error is the difference between this actual step magnitude in the first conversion sub-phase and the ideal step magnitude of $VREF/2^n$, or:

$$DNL1 = \frac{\Delta * VREF}{2C + \Delta} + \frac{C * VREF}{2^{n-1}[2C + \Delta]} - \frac{VREF}{2^n}$$

The actual magnitude of the DAC_OUT step in the second conversion sub-phase (FIG. 6B) is:

$$\frac{-\Delta * VREF}{2C + \Delta} + \frac{[C + \Delta] * VREF}{2^{n-1}[2C + \Delta]}$$

A resultant DNL error is, again, the difference between this actual step magnitude in the second conversion sub-phase and the ideal step magnitude of $VREF/2^n$, or:

$$DNL2 = \frac{-\Delta * VREF}{2C + \Delta} + \frac{[C + \Delta] * VREF}{2^{n-1}[2C + \Delta]} - \frac{VREF}{2^n}$$

Both DNL1 and DNL2 are 0 when Δ is equal to 0. However, even when Δ is non-zero, the functionality of the rotation logic implemented in FIGS. 6A and 6B effectively cancels the impact of the component mismatches and reduces or eliminates the DNL error. For example, the average DAC_OUT step over the first and second conversion sub-phases is:

$$0.5 * \left( \frac{\Delta * VREF}{2C + \Delta} + \frac{C * VREF}{2^{n-1}[2C + \Delta]} + \frac{-\Delta * VREF}{2C + \Delta} + \frac{[C + \Delta] * VREF}{2^{n-1}[2C + \Delta]} \right) =$$

$$0.5 * \left( \frac{VREF}{2^{n-1}} \right) = \frac{VREF}{2^n}$$

Which is the ideal step magnitude of $VREF/2^n$. Accordingly, the average DNL error is also 0.

Figure 7:
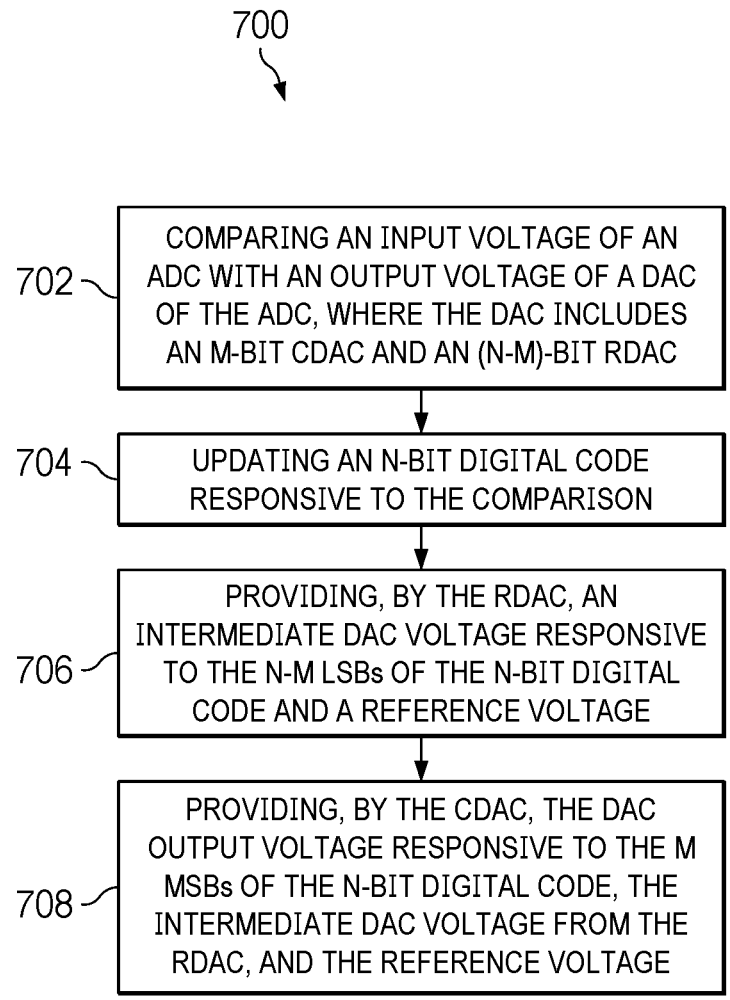
FIG. 7 is a flow chart of a method in accordance with various examples.

FIG. 7 is a flow chart of a method 700 in accordance with various examples. The method 700 begins in block 702 with comparing an input voltage of an ADC with an output voltage of a DAC of the ADC. For example, the analog input voltage VIN of ADC 100 is compared with the output of DAC 106 by the comparator 102, as described above. Also, the DAC 106 includes m-bit CDAC 204 and (n−m)-bit RDAC 202, and 0<m≤n.

The method 700 continues in block 704 with updating an n-bit digital code responsive to the comparison. For example, the SAR circuit 108 is configured to update the n-bit digital code in its SAR based on the comparator 102 output. The output of the ADC 100 is based on the n-bit digital code stored by the SAR circuit 108 when a conversion phase (or sub-phase) ends.

The method 700 continues further in block 706 with providing, by the RDAC 202, an intermediate DAC voltage responsive to the n−m LSBs of the n-bit digital code from the SAR circuit 108 and a reference voltage, such as VREF provided by the reference voltage generator 110. The method also continues in block 708 with providing, by the CDAC 204, the DAC 106 output voltage responsive to the m MSBs of the n-bit digital code, the intermediate DAC voltage from the RDAC 202, and the reference voltage VREF.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a parameter means being within +/−10 percent of that parameter, or, if the parameter is zero, a reasonable range of values around zero. Modifications are possible in the described examples, and other examples are possible within the scope of the claims.

What is claimed is:

1. An analog-to-digital converter (ADC), comprising:
an input adapted to receive an input voltage;
an output adapted to provide an output signal;
a comparator having a first input coupled to the input of the ADC, a second input, and an output, the comparator configured to provide a comparator output signal at the output responsive to the input voltage and a digital-to-analog converter (DAC) output voltage;
a successive-approximation register (SAR) circuit having an input coupled to the output of the comparator and including a SAR that is configured to store an n-bit digital code that is initialized to an initial value at a beginning of a conversion phase of the ADC, wherein the SAR circuit is configured to:
provide the n-bit digital code as an output signal at an output of the SAR circuit, the output of the ADC coupled to the output of the SAR circuit; and
update the n-bit digital code responsive to the comparator output signal, wherein the output signal of the ADC is responsive to the n-bit digital code at an end of the conversion phase; and
a DAC configured to provide the DAC output voltage responsive to the n-bit digital code and a reference voltage, wherein the DAC includes:
an m-bit capacitive DAC (CDAC) having a first input, having a second input coupled to the output of the SAR circuit, and having an output coupled to the second input of the comparator; and
an (n−m)-bit resistive DAC (RDAC) having an input coupled to the output of the SAR circuit and having an output coupled to the first input of the m-bit CDAC, the RDAC configured to provide an intermediate DAC voltage responsive to the n−m least-significant bits of the n-bit digital code and the reference voltage,
wherein the m-bit CDAC is configured to provide the DAC output voltage responsive to the m most-significant bits of the n-bit digital code, the intermediate DAC voltage, and the reference voltage.

2. The ADC of claim 1, wherein the conversion phase includes $2^m$ conversion sub-phases, wherein the ADC further comprises an output register coupled to the output of the SAR circuit and configured to store the n-bit digital code from the SAR circuit at the end of each of the $2^m$ conversion sub-phases, wherein the output signal of the ADC is based on a sum of the $2^m$ n-bit digital codes stored in the output register at an end of the $2^m$ conversion sub-phase.

3. The ADC of claim 2, wherein the output signal of the ADC is an average of the $2^m$ n-bit digital codes stored in the output register at the end of the $2^m$ conversion sub-phase.

4. The ADC of claim 2, wherein the CDAC includes $2^m$ capacitors and rotation logic configured to provide the intermediate DAC voltage to a different one of the $2^m$ capacitors in each of the $2^m$ conversion sub-phases.

5. The ADC of claim 4, wherein the CDAC is configured to derive $2^m-1$ control signals from the m most-significant bits of the n-bit digital code from the SAR circuit, wherein the rotation logic is configured to control a coupling of each of the capacitors, other than the capacitor to which the intermediate DAC voltage is provided, with a different one of the control signals in each of the $2^m$ conversion sub-phases.

6. The ADC of claim 5, wherein the coupling of a capacitor is either to receive the reference voltage, or to be coupled to a ground terminal.

7. The ADC of claim 5, wherein the control signals are thermometric-decoded values of the m most-significant bits of the n-bit digital code.

8. The ADC of claim 5, wherein m is at least 2, wherein the capacitors include first through fourth capacitors, wherein the conversion sub-phases include first through fourth conversion subphases, wherein the control signals include first through third control signals, and wherein the rotation logic is configured to:
 during the first conversion sub-phase:
  provide the intermediate DAC voltage to the first capacitor;
  control the coupling of the second capacitor with the first control signal;
  control the coupling of the third capacitor with the second control signal; and
  control the coupling of the fourth capacitor with the third control signal;
 during the second conversion sub-phase:
  provide the intermediate DAC voltage to the second capacitor;
  control the coupling of the third capacitor with the first control signal;
  control the coupling of the fourth capacitor with the second control signal; and
  control the coupling of the first capacitor with the third control signal;
 during the third conversion sub-phase:
  provide the intermediate DAC voltage to the third capacitor;
  control the coupling of the fourth capacitor with the first control signal;
  control the coupling of the first capacitor with the second control signal; and
  control the coupling of the second capacitor with the third control signal; and
 during the fourth conversion sub-phase:
  provide the intermediate DAC voltage to the fourth capacitor;
  control the coupling of the first capacitor with the first control signal;
  control the coupling of the second capacitor with the second control signal; and
  control the coupling of the third capacitor with the third control signal.

9. A method of operating an analog-to-digital converter (ADC) including a digital-to-analog converter (DAC) that includes an m-bit capacitive DAC (CDAC) and an (n–m)-bit resistive DAC (RDAC), the method comprising:
 comparing an input voltage of the ADC with an output voltage at an output of the CDAC;
 updating an n-bit digital code responsive to the comparison, wherein an output signal of the ADC is responsive to the n-bit digital code at the end of a conversion phase;
 providing, at an output of the RDAC to an input of the CDAC, an intermediate DAC voltage responsive to the n–m least-significant bits of the n-bit digital code and a reference voltage; and
 providing, by the CDAC, the DAC output voltage responsive to the m most-significant bits of the n-bit digital code, the intermediate DAC voltage, and the reference voltage.

10. The method of claim 9, wherein the conversion phase includes $2^m$ conversion sub-phases, wherein the method further comprises storing, in an output register, the n-bit digital code from the SAR circuit at the end of each of the $2^m$ conversion sub-phases, wherein the output signal of the ADC is based on a sum of the $2^m$ n-bit digital codes stored in the output register at an end of the $2^m$ conversion sub-phase.

11. The method of claim 10, wherein the output signal of the ADC is an average of the $2^m$ n-bit digital codes stored in the output register at the end of the $2^m$ conversion sub-phase.

12. The method of claim 10, wherein the CDAC includes $2^m$ capacitors, wherein the method further comprises providing the intermediate DAC voltage to a different one of the $2^m$ capacitors in each of the $2^m$ conversion sub-phases.

13. The method of claim 12, further comprising:
 deriving, by the CDAC, $2^m-1$ control signals from the m most-significant bits of the n-bit digital code; and
 controlling, by the CDAC, a coupling of each of the capacitors, other than the capacitor to which the intermediate DAC voltage is provided, with a different one of the control signals in each of the $2^m$ conversion sub-phases.

14. The method of claim 13, wherein the coupling of a capacitor is either to receive the reference voltage, or to be coupled to a ground terminal.

15. The method of claim 13, wherein the control signals are thermometric-decoded values of the m most-significant bits of the n-bit digital code.

16. The method of claim 13, wherein m is at least 2, wherein the capacitors include first through fourth capacitors, wherein the conversion sub-phases include first through fourth conversion subphases, wherein the control signals include first through third control signals, and wherein the method further comprises:
 during the first conversion sub-phase:
  providing the intermediate DAC voltage to the first capacitor;
  controlling the coupling of the second capacitor with the first control signal;
  controlling the coupling of the third capacitor with the second control signal; and
  controlling the coupling of the fourth capacitor with the third control signal;
 during the second conversion sub-phase:
  providing the intermediate DAC voltage to the second capacitor;
  controlling the coupling of the third capacitor with the first control signal;
  controlling the coupling of the fourth capacitor with the second control signal; and
  controlling the coupling of the first capacitor with the third control signal;
 during the third conversion sub-phase:
  providing the intermediate DAC voltage to the third capacitor;
  controlling the coupling of the fourth capacitor with the first control signal;
  controlling the coupling of the first capacitor with the second control signal; and
  controlling the coupling of the second capacitor with the third control signal; and during the fourth conversion sub-phase:
providing the intermediate DAC voltage to the fourth capacitor;
controlling the coupling of the first capacitor with the first control signal;
controlling the coupling of the second capacitor with the second control signal; and
controlling the coupling of the third capacitor with the third control signal.

17. An analog-to-digital converter (ADC) having an input operable to receive an input voltage and an output operable to provide a digital representation of the input voltage, the ADC comprising:
a comparator having a first input coupled to the input of the ADC, a second input, and an output, the comparator configured to provide a comparator output signal at the output responsive to the input voltage and a digital-to-analog converter (DAC) output voltage;
a DAC configured to provide the DAC output voltage responsive to an n-bit digital code, wherein the DAC includes:
an m-bit capacitive DAC (CDAC), wherein m is an integer greater than zero but less than n, the m-bit CDAC having an input and having an output coupled to the second input of the comparator; and
an (n−m)-bit resistive DAC (RDAC) having an output coupled to the input of m-bit CDAC, the RDAC configured to provide an intermediate DAC voltage to the m-bit CDAC responsive to the n−m least-significant bits of the n-bit digital code and the reference voltage,
wherein the m-bit CDAC is configured to provide the DAC output voltage responsive to the m most-significant bits of the n-bit digital code, the intermediate DAC voltage, and the reference voltage; and
wherein an output signal of the ADC is based on a sum of the n-bit digital codes at an end of each of $2^m$ conversion sub-phases.

18. The ADC of claim 17, wherein the CDAC includes $2^m$ capacitors and rotation logic configured to provide the intermediate DAC voltage to a different one of the $2^m$ capacitors in each of the $2^m$ conversion sub-phases.

19. The ADC of claim 18, wherein the CDAC is configured to derive $2^m-1$ control signals from the m most-significant bits of the n-bit digital code from the SAR circuit, wherein the rotation logic is configured to control a coupling of each of the capacitors, other than the capacitor to which the intermediate DAC voltage is provided, with a different one of the control signals in each of the $2^m$ conversion sub-phases.

20. The ADC of claim 19, wherein m is at least 2, wherein the capacitors include first through fourth capacitors, wherein the conversion sub-phases include first through fourth conversion subphases, wherein the control signals include first through third control signals, and wherein the rotation logic is configured to:
during the first conversion sub-phase:
provide the intermediate DAC voltage to the first capacitor;
control the coupling of the second capacitor with the first control signal;
control the coupling of the third capacitor with the second control signal; and
control the coupling of the fourth capacitor with the third control signal;

during the second conversion sub-phase:
provide the intermediate DAC voltage to the second capacitor;
control the coupling of the third capacitor with the first control signal;
control the coupling of the fourth capacitor with the second control signal; and
control the coupling of the first capacitor with the third control signal;
during the third conversion sub-phase:
provide the intermediate DAC voltage to the third capacitor;
control the coupling of the fourth capacitor with the first control signal;
control the coupling of the first capacitor with the second control signal; and
control the coupling of the second capacitor with the third control signal; and
during the fourth conversion sub-phase:
provide the intermediate DAC voltage to the fourth capacitor;
control the coupling of the first capacitor with the first control signal;
control the coupling of the second capacitor with the second control signal; and
control the coupling of the third capacitor with the third control signal.

21. An analog-to-digital converter (ADC) having an analog input terminal and a digital output terminal, and comprising:
a comparator having an input and an output;
a successive-approximation register (SAR) circuit having an input coupled to the output of the comparator, and having a first output coupled to the digital output terminal, and having a second output;
a capacitive DAC (CDAC) having a reference input, having a first input, having a second input coupled to the second output of the SAR circuit, and having an output coupled to the input of the comparator;
a resistive DAC (RDAC) having a reference input, having an input coupled to the second output of the SAR circuit, and having an output coupled to the first input of the CDAC; and
a reference voltage generator having an output coupled to the reference inputs of the CDAC and the RDAC.

22. The ADC of claim 21, wherein the CDAC includes:
a first capacitor having first and second terminals, the second terminal coupled to the input of the comparator;
a second capacitor having first and second terminals, the second terminal of the second capacitor coupled to the input of the comparator; and
circuitry configured in a first conversion phase to:
couple the first terminals of the first and second capacitors to the analog input terminal responsive to a first control signal;
couple the first terminal of the first capacitor to the output of the RDAC responsive to a second control signal; and
couple the first terminal of the second capacitor to the output of the reference voltage generator responsive to a signal at the output of the SAR circuit.

23. The ADC of claim 22, wherein the circuitry of the CDAC is configured in a second conversion phase to:
couple the first terminal of the second capacitor to the output of the RDAC responsive to the second control signal; and couple the first terminal of the first capacitor to the output of the reference voltage generator responsive to the signal at the output of the SAR circuit.

* * * * *